United States Patent [19]
Koizumi

[11] Patent Number: 5,712,767
[45] Date of Patent: Jan. 27, 1998

[54] CIRCUIT ELEMENTS MOUNTING

[75] Inventor: Takao Koizumi, Tokyo, Japan

[73] Assignee: NEC Corporation, Japan

[21] Appl. No.: 559,448

[22] Filed: Nov. 15, 1995

[30] Foreign Application Priority Data

Nov. 16, 1994 [JP] Japan .................... 6-306940

[51] Int. Cl.⁶ .............. H05K 1/00; H05K 1/11; H01R 9/09
[52] U.S. Cl. .................. 361/761; 361/764; 439/69; 439/74; 439/78
[58] Field of Search .................. 361/761, 763, 361/764; 257/723, 724, 786; 439/69, 74, 78, 83, 68; 235/492; 343/872, 873

[56] References Cited

U.S. PATENT DOCUMENTS

| | | | |
|---|---|---|---|
| 4,539,622 | 9/1985 | Akasaki | 361/764 |
| 4,903,120 | 2/1990 | Beene et al. | 257/723 |
| 4,924,353 | 5/1990 | Patraw | 361/764 |
| 5,200,810 | 4/1993 | Wojnarowski | 361/750 |
| 5,450,046 | 9/1995 | Kosugi et al. | 361/761 |
| 5,598,032 | 1/1997 | Fidalgo | 343/873 |

FOREIGN PATENT DOCUMENTS

| | | | |
|---|---|---|---|
| 60-263451 | 12/1985 | Japan | 257/697 |
| 60-263452 | 12/1985 | Japan | 257/697 |
| 6232608 | 8/1994 | Japan . | |
| 1 488 226 | 10/1977 | United Kingdom | 349/149 |

*Primary Examiner*—Leo P. Picard
*Assistant Examiner*—John B. Vigushin
*Attorney, Agent, or Firm*—Ostrolenk, Faber, Gerb & Soffen, LLP

[57] ABSTRACT

The invention provides a circuit element mounting structure including (a) a substrate having a pattern A of wirings therein, (b) at least one cavity formed at a surface the substrate, and (c) a cap for covering the cavity therewith, the cap including a pattern B of wirings therein and a recess for electrically connecting the pattern B of wirings the pattern A of wirings. The substrate includes a protrusion for electrically connecting connection B to the pattern A of wirings. The recess and protrusion are configured to engage each other. In accordance with the invention, it is now possible to mount circuit elements on a cap which had been a dead space in prior circuit, and hence also possible to mount circuit elements in higher density on a substrate including a cap zone.

20 Claims, 9 Drawing Sheets

CIRCUIT ELEMENTS MOUNTING

BACKGROUND OF THE INVENTION

1. Field of the Invention

The invention relates to a circuit elements mounting structure in which a cavity which is formed at a surface of a substrate and in which circuit elements are to be contained is covered with a cap, and more particularly to such circuit elements mounting structure suitable for use of complex microwave circuit module.

2. Description of the Related Art

A structure such as complex microwave circuit module for mounting electronic elements on a microwave circuit in higher density is often used these days. An example of complex microwave circuit modules comprising a multi-layered substrate has been suggested in Japanese Unexamined Patent Public Disclosure No. 6-232608, and is illustrated in FIGS. 1 and 2.

As illustrated, the complex circuit module includes gland surfaces at upper and lower surfaces 501 and 504 of a multi-layered dielectric substrate 500, and also includes rf signal layers 502 and 503 intermediate the upper and lower surfaces 501 and 504. The rf signal layers 502 and 503 are composed of conductive layers for transmitting signals therethrough, and serve as signal transmitting circuits. A cavity 505 into which a later mentioned cap is to be fitted is formed by boring a hole from an upper surface 500a of the substrate to the gland upper surface 501. Furthermore, from the gland upper surface 501 to the rf signal layer 502 is bored a cavity 507 in which active elements 506 and passive elements (not illustrated) are to be mounted. As will be obvious, the cavity 507 has a smaller inner diameter than that of the cavity 505. After these elements have been mounted in the cavity 507, the cavity 505 is covered with a metal cap 508 in order to protect the active and passive elements from dust, moisture and so on. The rf signal layer 502 is made up of various wirings, and is also formed thereon with a DC pattern 509. On the upper surface 500a of the substrate 500 are to be mounted a plurality of surface mount devices 510 for accomplishing large scale integration.

As mentioned above, the cavities 505 and 507 are formed in order to mount various elements on the rf signal layer 502 of the complex microwave circuit module. However, it is naturally impossible to form a pattern and/or mount surface mount devices 510 on the cavities. Namely, the formation of cavities decreases an area in which a pattern is formed and/or surface mount devices are mounted, thereby making it difficult to accomplish higher integration.

SUMMARY OF THE INVENTION

In view of the above mentioned problem in the prior art, it is an object of the present invention to mount elements in higher density on a circuit substrate having cavities therein.

The invention provides a circuit element mounting structure including (a) a substrate having a pattern A of wirings therein, (b) at least one cavity formed at a surface of the substrate, and (c) a cap for covering the cavity therewith. The cap includes (a) a pattern B of wirings therein, and (b) at least one connection B for electrically connecting the pattern B of wirings to the pattern A of wirings. The substrate includes at least one connection A for electrically connecting the connection B to the pattern A of wirings.

The invention further provides a circuit element mounting structure including (a) a substrate having a pattern A of wirings therein, (b) at least one cavity formed at a surface of the substrate, and (c) a cap for covering the cavity therewith. The cap includes (a) a pattern B of wirings therein and (b) at least one of a recess and a protrusion for electrically connecting the pattern B of wirings to the pattern A of wirings, and the substrate includes at least one of a protrusion and a recess, respectively, for electrically connecting the connection B to the pattern A of wirings. The recess and protrusion are configured to engage to each other.

The invention still further provides a circuit element mounting structure including (a) a substrate having a pattern A of wirings therein, (b) at least one cavity formed at a surface of the substrate, and (c) a cap for covering the cavity therewith. The cap includes (a) a pattern B of wirings therein, and (b) a flat surface C having an inclination with respect to a vertical axis of the cap. The flat surface C is adapted for electrically connecting the pattern B of wirings to the pattern A of wirings. The substrate includes a flat surface D having the same inclination as that of the flat surface C, the flat surface D adapted for electrically connecting the connection B to the pattern A of wirings. The flat surfaces C and D are configured to come to faring contact with each other.

The invention yet further provides a circuit element mounting structure includes (a) a substrate having a pattern A of wirings therein, (b) at least one cavity formed at a surface of the substrate, and (c) a cap for covering the cavity therewith. The cap includes (a) a pattern B of wirings therein and (b) an outwardly directing arcuate surface E for electrically connecting the pattern B of wirings to the pattern A of wirings. The substrate includes an inwardly directing arcuate surface F for electrically connecting the connection B to the pattern A of wirings. The arcuate surfaces E and F are configured to fit with each other.

The invention still yet further provides a circuit element mounting structure including (a) a substrate having a pattern A of wirings therein, (b) at least one cavity formed at a surface of the substrate, and (c) a cap for covering the cavity therewith The cap includes (a) a pattern B of wirings therein, and (b) one of a recess, a protrusion an inclined flat surface C, and an outwardly directing arcuate surface E, each of which is adapted for electrically connecting the pattern B of wirings to the pattern A of wirings. In accordance with the cap, the substrate includes a protrusion, a recess, a flat surface D having the same inclination as that of the flat surface C, or an inwardly directing arcuate surface F, each of which is adapted for electrically connecting the connection B to the pattern A of wirings. The recess and protrusion are configured to engage to each other, the flat surfaces C and D are configured to come to facing contact with each other, and the arcuate surfaces E and F are configured to fit with each other.

In accordance with the invention, a pattern of wirings is also formed in or on the cap. Thus, there no longer exist an obstacle for forming a pattern of wirings, even if there are formed cavities. As a result, it is possible to mount circuit elements in higher density on a substrate having cavities therein which are to be covered with a cap.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings. In the embodiments described hereinbelow, the circuit element mounting structure in accordance with the invention is applied to a complex microwave circuit module.

Figure 1:
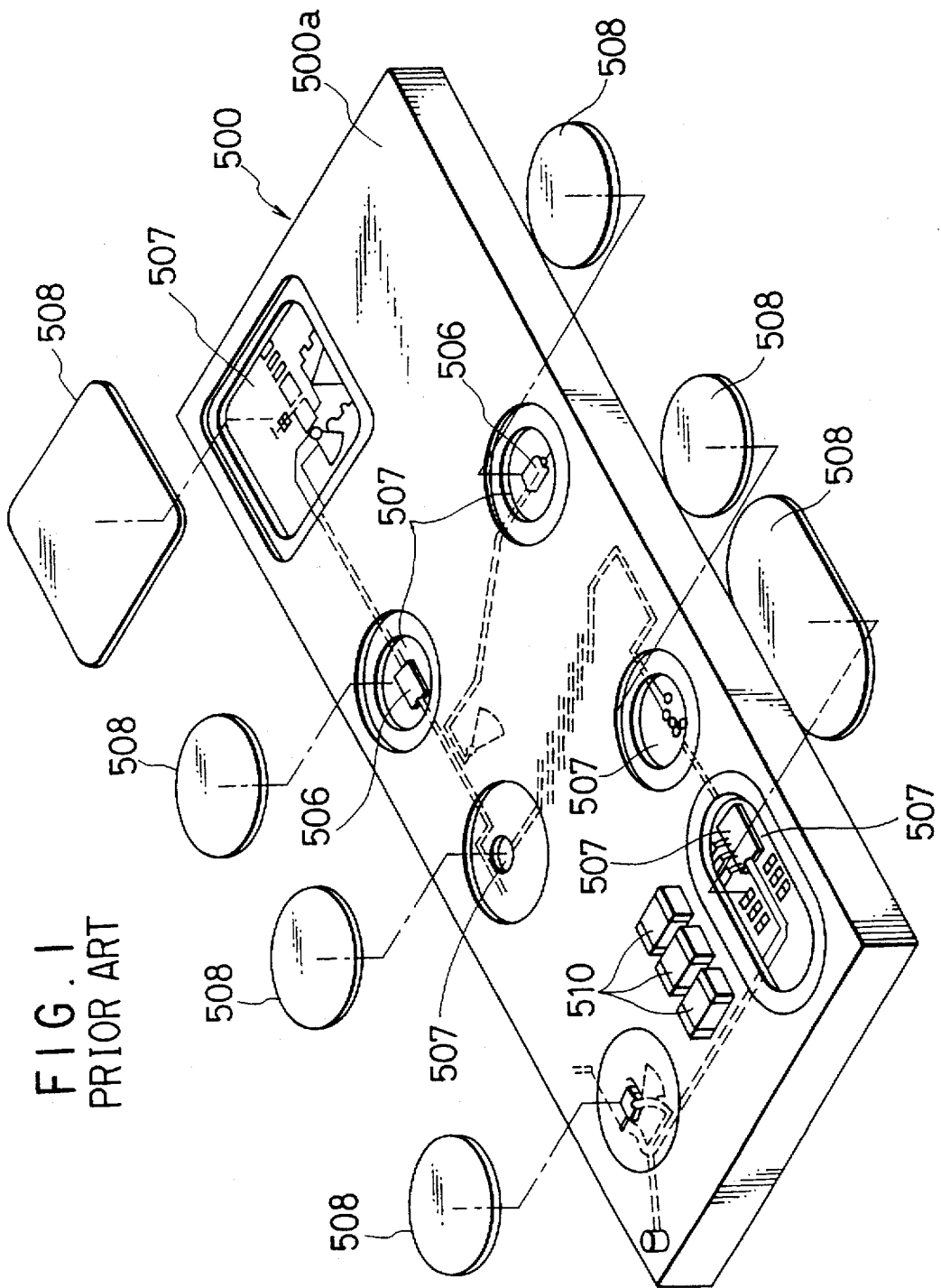
FIG. 1 is a perspective view illustrating a conventional complex microwave circuit module.
Figure 2:
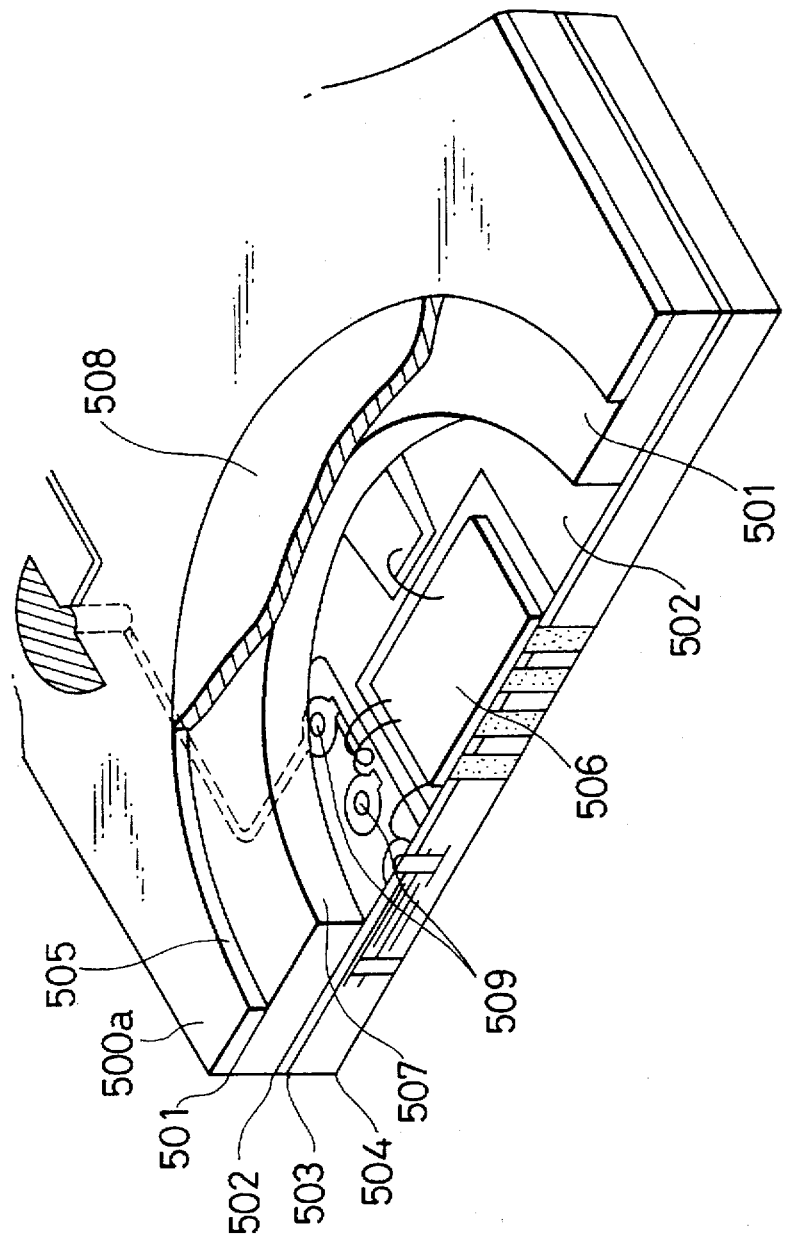
FIG. 2 is a perspective cross-sectional view of the module illustrated in FIG. 1.
Figure 3:
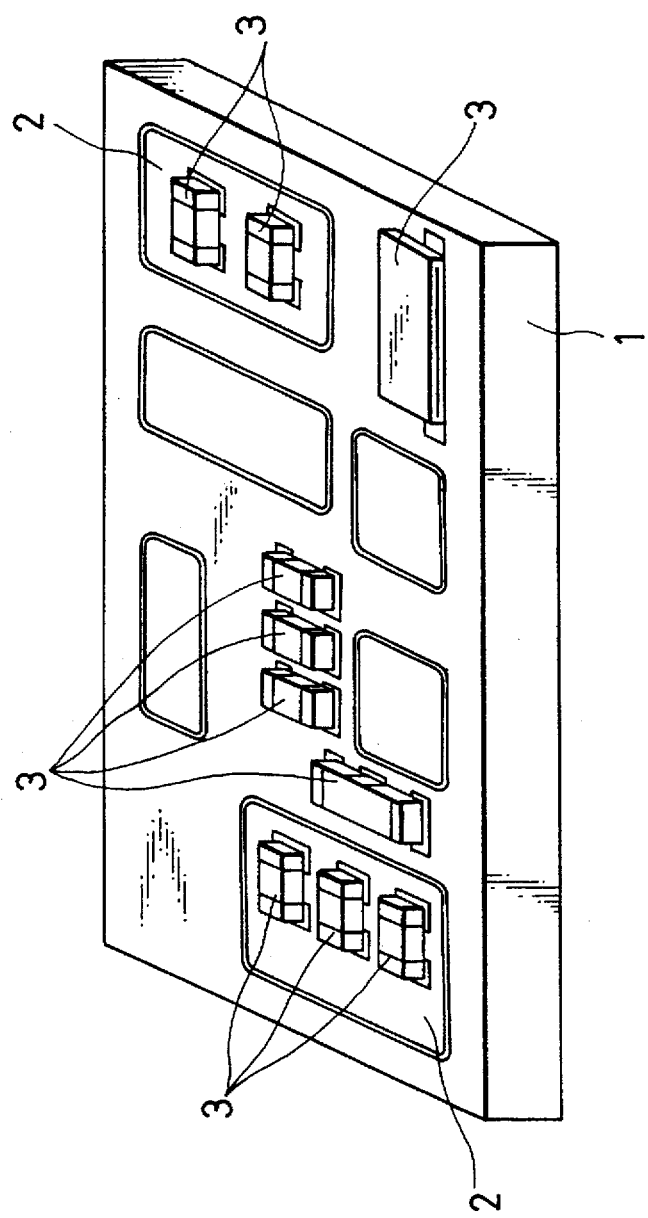
FIG. 3 is a perspective view illustrating a complex microwave circuit module in accordance with the first embodiment of the invention.
Figure 4A:
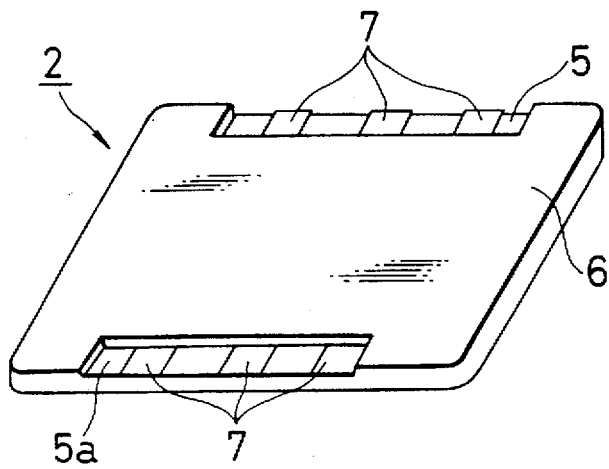
FIG. 4A is a perspective bottom view of the cap to be used in the first embodiment.
Figure 4B:
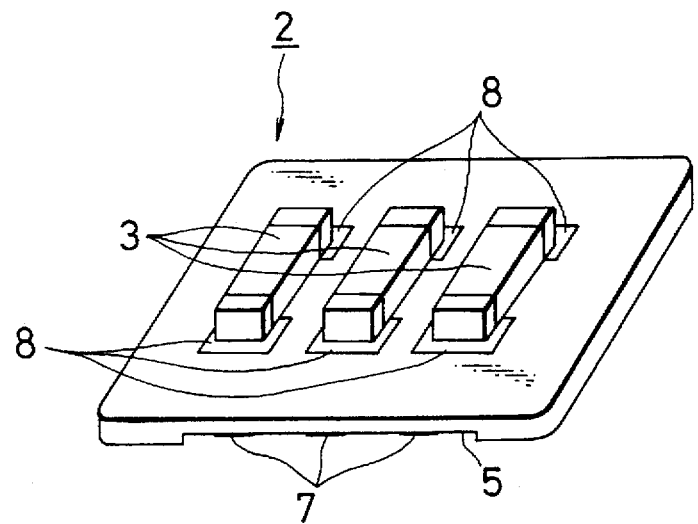
FIG. 4B is a perspective view of the cap illustrated in FIG. 4A.
Figure 4C:
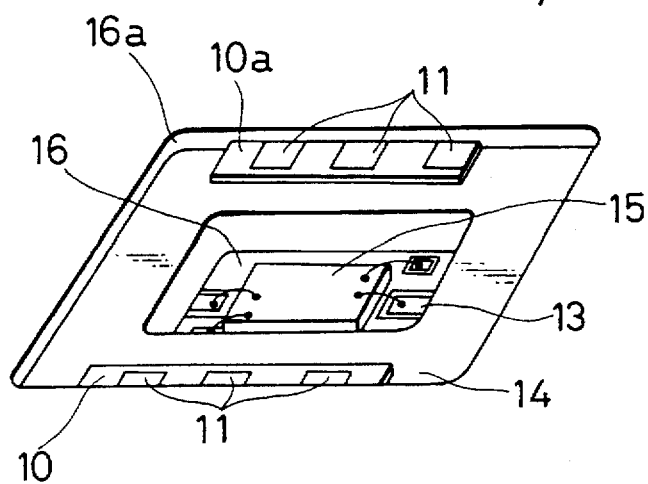
FIG. 4C is a perspective of the cavity into which the cap illustrated in FIGS. 4A and 4B is to be fitted.
Figure 5:
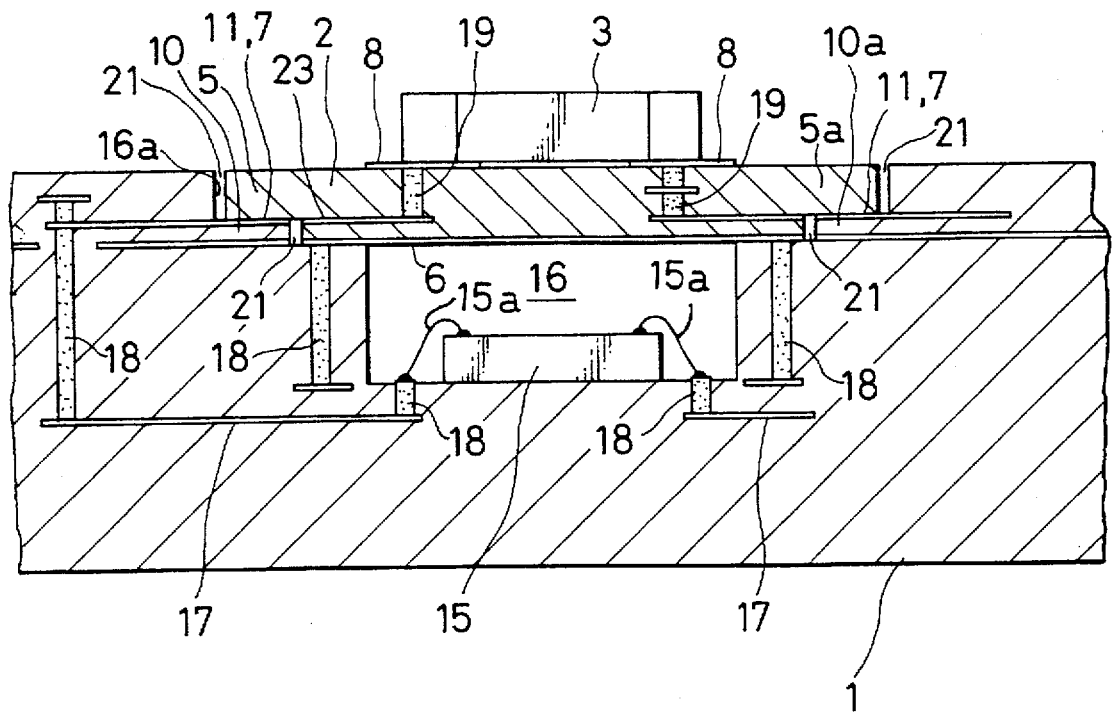
FIG. 5 is a cross-sectional view of the cap and the cavity into which the cap is fitted in the first embodiment.

With reference to FIGS. 3 to 5, a complex microwave circuit module 1 is composed of a multi-layered ceramic substrate having an inner layer formed with a cavity 16 in which a signal pattern 13 is formed and active elements 15 such as a transistor and a diode are to be mounted, as illustrated in FIG. 4C. The cavity 16 is to be covered with a cap 2 illustrated in FIGS. 4A and 4B in order to protect the active elements 15 disposed therein from dust and humidity. From an upper edge of the cavity 16 to a surface of the module 1 is formed a cavity 16a into which the cap 2 is to be fitted.

As illustrated in FIG. 5, the cap 2 is composed of a three-layered ceramic substrate, and is smaller in size than the cavity 16a by hundreds of micrometers. The cap 2 is formed on an upper surface thereof with a pattern 8 of wirings on which surface mount devices 3 are to be mounted. In addition, a dc pattern 23 of wirings composed of silver or copper is formed within the cap 2. The patterns 8 and 23 are electrically connected to each other through a via or connector 19 formed in the cap 2.

In the module 1 are also formed a dc pattern 17 of wirings. Through a via or connector 18, the dc pattern is electrically connected a wiring 15a extending from the active element 15.

As illustrated in FIG. 4A, the cap 2 is formed at a bottom surface thereof with a pair of recesses 5 and 5a on each of which is formed a terminal pattern 7. Each of the terminal pattern 7 is electrically connected to the dc pattern 23. An entire bottom surface of the cap 2 defines a gland pattern 6.

As illustrated in FIG. 4C, the module 1 is formed with a pair of protrusions 10 and 10a on each of which is formed a terminal pattern 11. By covering the module with the cap 2, the recesses 5 and 5a of the cap 2 are engaged to the protrusions 10 and 10a of the module 1 to thereby connect the terminal patterns 7 and 11 with each other.

The recess 5 is different in shape from the recess 5a, and the recess 5 is engagable only to the protrusion 10, while the recess 5a is engagable only to the protrusion 10a. Namely, the cap 2 can be fitted into the cavity 16a only when the recess 5 is engaged to the protrusion 10 and the recess 5a is engaged to the protrusion 10a. Thus, it is avoidable to fit the cap 2 into the cavity 16a in wrong.

A bottom of the cavity 16a formed in the module 1 defines a gland pattern 14. When the cap 2 is fitted into the cavity 16a, the gland pattern 6 of the cap 2 comes to direct contact with the gland pattern 14 of the cavity 16a.

The cap 2 is fixedly connected to the module 1 by soldering the terminal patterns 7 and 11 to each other and also soldering the gland patterns 6 and 14 to each other. The soldering ensures electrical contact between the terminal patterns 7 and 11, and sealing of the cavity 16a. Since the bottom surface of the cap 2 defines the gland pattern 6, electrical shielding in the cavity 16 can be obtained.

As mentioned earlier, the cap 2 is designed to be slightly smaller in size than the cavity 16a to thereby produce a gap 21 between the cap 2 and the module 1. Thus, when the cap 2 is soldered to the module 1, it is possible to spread a solder as the cap 2 is slightly moved to thereby ensure wettability of a solder.

Though the cap 2 is formed at either side with one recess 5 or 5a, a plurality of recesses may be formed, in which case the module 1 is to be formed with the same number of protrusions. In addition, if a plurality of recesses are to be formed, it is not always necessary for the recesses to have the same configuration. The recesses, and hence the protrusions associated therewith, may have different shape from one another.

The cap 2 has a thickness equal to a depth of the cavity 16a. However, the cap 2 may be designed to have a thickness greater or smaller than a depth of the cavity 16a.

Hereinbelow is explained the steps of assembling the complex microwave circuit module 1. First, the active elements 15 are mounted in the cavity 16 of the module 1 by soldering as illustrated in FIGS. 4C and 5, and then the surface mount devices 3 are mounted on the surface of the module 1 by soldering as illustrated in FIG. 3. Similarly, the surface mount devices 3 are mounted on the cap 2 by soldering. Then, the cap 2 on which the surface mount devices 3 have been mounted is soldered to the module 1 by using a solder having a lower melting point than that of the solder having been used for mounting the surface mount devices 3 on the cap 2.

The circuit element mount structure as mentioned above ensures that a pattern of wirings can be formed in a region which has conventionally been a dead space, and that surface mount devices can be mounted in such a region, resulting in the elimination of a dead space and mounting elements in higher integration.

Even if the cavity 16 is formed large, airtightness obtained when the cavity 16 is covered with the cap 2 can be enhanced by designing the cap 2 to be correspondingly large and further designing the gland pattern 14 to be large which plays a role of solder margin of the module 1.

Since the lower surface of the cap 2 defines the gland pattern 6, the sealing with the cap 2 provides the electrical shield effect. An electrically conductive adhesive may be used in place of solder. Such an adhesive enhances the assembling efficiency of the module.

The formation of the terminal patterns 7 and 11 on the recesses 5, 5a and the protrusions 10, 10a provides an advantage that it is possible to avoid solder for connecting the gland patterns 6 and 14 to each other from entering the terminal patterns 7 and 11. The entrance of the solder into the terminal patterns is avoidable in particular by designing the cap 2 to have recesses and the cavity 16a to have protrusions.

As mentioned earlier, the recess 5 and the protrusion 10 are different in shape from the recess 5a and the protrusion 10a. If the cap 2 is about to be fitted into the cavity 16a in wrong direction, the recess is not engaged to the protrusion, and hence the cap 2 cannot be fitted into the cavity 16a. Thus, the difference in shape between the recesses 5 and 5a and between the protrusions 10 and 10a ensures that the cap 2 is always correctly fitted into the cavity 16a.

In the embodiment, the surface mount devices 3 are mounted on the cap 2. However, it should be noted that the surface mount devices 3 may not be mounted on the cap 2, and that the cap 2 may be formed only with the dc pattern 23. It should be also noted that the application of the invention is not to be limited to a complex microwave circuit module as described in the above embodiment, but the invention can be applied to other circuit substrate, if it has an element mount structure in which a cavity formed in a substrate is covered with a cap.

In the above embodiment, the cap 2 is designed to have the recesses 5, 5a, while the module 1 is designed to have the protrusions 10, 10a. It should be noted that the cap 2 and the module 1 may be designed to have protrusions and recesses, respectively. In addition, the cap 2 may be designed to have both a recess and a protrusion, in which case the module 1 is designed to have a protrusion and a recess correspondingly.

In the above embodiment, a connection for connecting the pattern 7 of the cap 2 to the pattern 11 of the module 1 comprises a combination of the recess 5, 5a and the protrusion 10, 10a. The connection for connecting the patterns of the cap and the module to each other is not to be limited to such a combination. The connection may have another configuration.

Figure 6A:
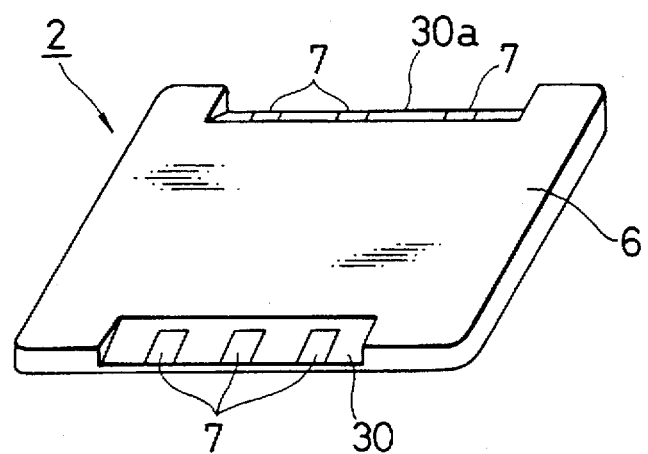
FIG. 6A is a perspective bottom view of the cap to be used in the second embodiment.
Figure 6B:
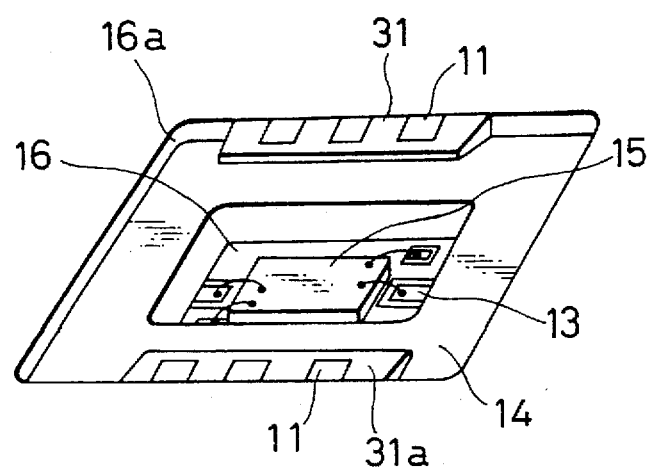
FIG. 6B is a perspective of the cavity into which the cap illustrated in FIG. 6A is to be fitted.
Figure 7:
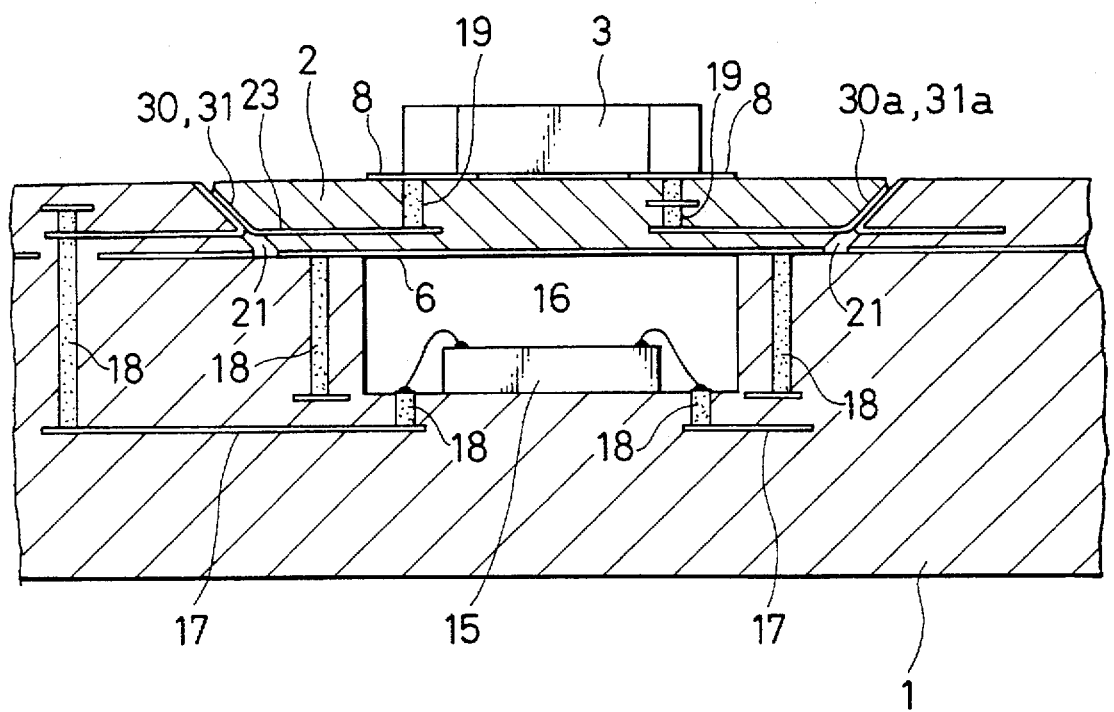
FIG. 7 is a cross-sectional view of the cap and the cavity into which the cap is fitted in the second embodiment.

For instance, as illustrated in FIGS. 6A, 6B and 7, the connection may comprise a combination of flat surfaces each having the same inclination. As illustrated in FIG. 6A, the cap 2 is formed at a lower surface thereof with inclined surfaces 30, 30a having a certain inclination. On the inclined surfaces 30, 30a are formed the pattern 7 of wirings, similarly to the first embodiment.

On the other hand, as illustrated in FIG. 6B, the module 1 is designed to have a pair of protrusions each having a triangular cross-section. Each of the protrusions has an inclined surface 31, 31a having the same inclination as that of the inclined surfaces 30, 30a of the cap 2. On the inclined surfaces 31, 31a are formed the pattern 11 of wirings.

Thus, as illustrated in FIG. 7, when the cap 2 is fitted into the cavity 16a, the inclined surfaces 30, 30a of the cap 2 comes to facing, direct contact with the inclined surfaces 31, 31a of the module with the result that the pattern 7 of the cap 2 coming to contact with the pattern 11 of the module 11. The combination of the inclined surfaces 30, 30a of the cap 2 and the inclined surfaces 31, 31a of the module 1 having the same inclination as that of the inclined surfaces 30, 30a ensures the same advantages as those obtained by the first embodiment.

Figure 8A:
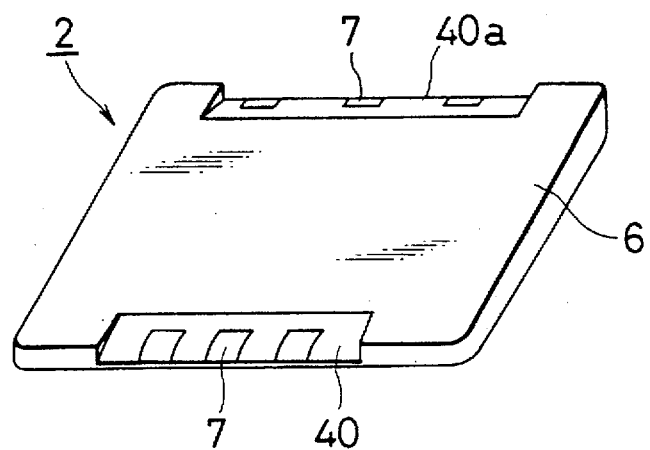
FIG. 8A is a perspective bottom view of the cap to be used in the third embodiment.
Figure 8B:
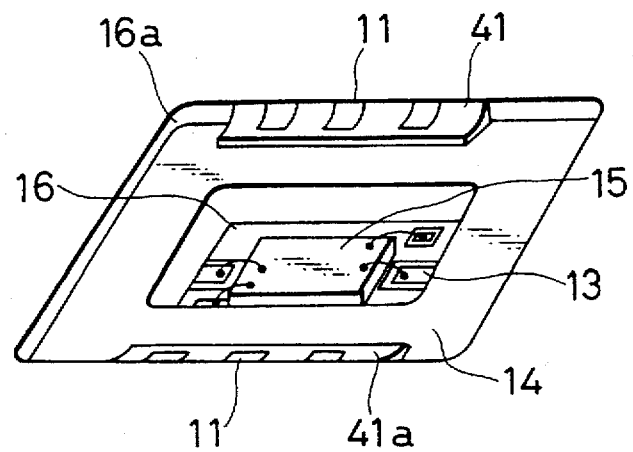
FIG. 8B is a perspective of the cavity into which the cap illustrated in FIG. 8A is to be fitted.
Figure 9:
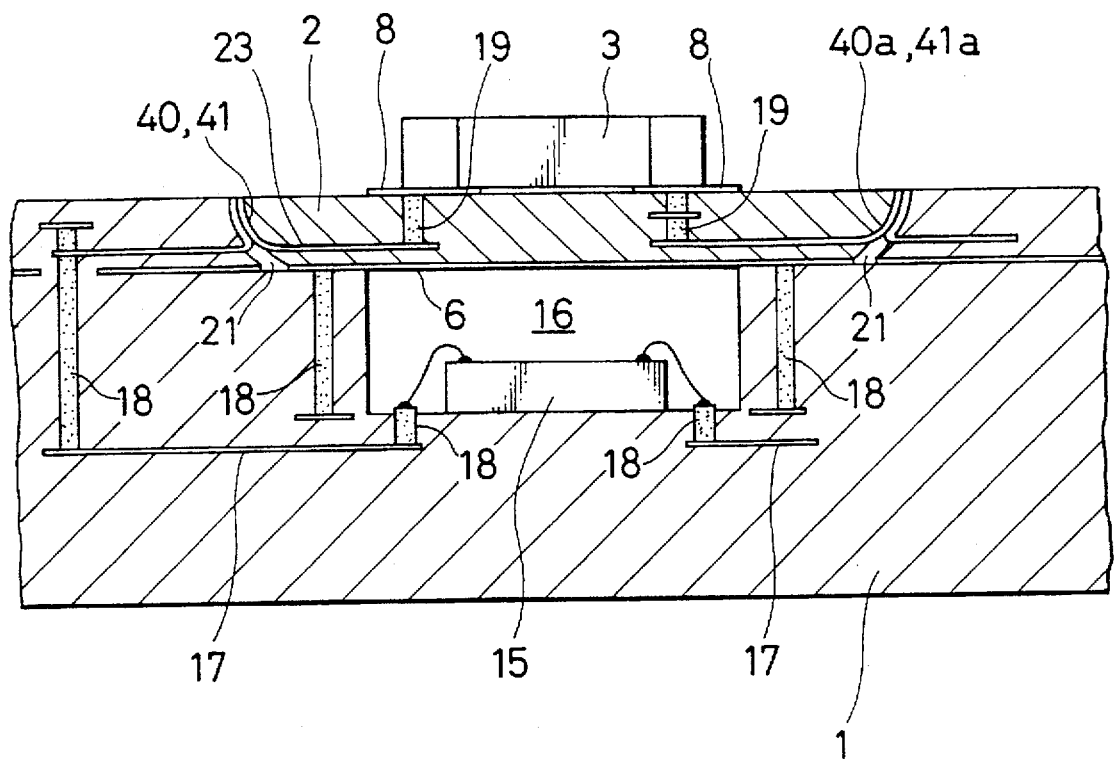
FIG. 9 is a cross-sectional view of the cap and the cavity into which the cap is fitted in the third embodiment.

FIGS. 8A, 8B and 9 illustrates another example of the connection for connecting the patterns of the cap and the module to each other. As illustrated in FIG. 8A, the cap 2 is formed at a lower surface thereof with a pair of outwardly directing arcuate surfaces 40, 40a. On the arcuate surfaces 40, 40a are formed the pattern 7 of wirings, similarly to the first embodiment.

On the other hand, as illustrated in FIG. 8B, the module 1 is designed to have a pair of convexes each having an inwardly directing arcuate surface 41, 41a. On the inwardly directing surfaces 41, 41a are formed the pattern 11 of wirings.

On the other hand, as illustrated in FIG. 8B, the module 1 is designed to have a pair of protrusions each having an inwardly directing arcuate surface 41, 41a having the same curvature as that of the arcuate surfaces 41, 41a of the cap. On the inwardly directing arcuate surfaces 41, 41a are formed the pattern 11 of wirings.

Thus, as illustrated in FIG. 9, when the cap 2 is fitted into the cavity 16a, the outwardly directing arcuate surfaces 40, 40a of the cap 2 comes to faring, direct contact with the inwardly directing arcuate surfaces 41, 41a of the module 1 with the result that the pattern 7 of the cap 2 coming to contact with the pattern 11 of the module 11. The combination of the outwardly directing arcuate surfaces 40, 40a of the cap 2 and the inwardly directing arcuate surfaces 41, 41a of the module 1 having the same curvature as that of the outwardly directing arcuate surfaces 40, 40a ensures the same advantages as those obtained by the first embodiment.

Finally, though the connection for connecting the pattern of the cap to the pattern of the module is composed of one configuration in the above mentioned embodiments, the connection may comprise different configurations. For instance, the connection formed with the cap 2 may have one or more of the recess 5, the protrusion 10, the inclined surface 30 and the outwardly directing arcuate surface 40, in which case the connection formed with the module 1 is to be designed to have the protrusion 10, the recess 5, the inclined surface 31 and the inwardly directing arcuate surface 41, respectively.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A circuit element mounting structure comprising:

a substrate having a pattern A of wirings therein;

at least one cavity formed at a surface of said substrate; and a cap for covering said cavity therewith, said cap including (a) a pattern B of wirings therein and (b) at least one connection B for electrically connecting said pattern B of wirings to said pattern A of wirings;

said substrate including at least one connection A for electrically connecting said connection B to said pattern A of wirings;

said cap having a thickness equal to a depth of said cavity.

2. The circuit element mounting structure as set forth in claim 1, wherein said cap is formed at a surface thereof with at least one terminal for electrically connecting said cap to a circuit element to be mounted on said cap.

3. The circuit element mounting structure as set forth in claim 1, wherein said cap is slightly smaller in size than said cavity so that there is formed a gap between said cap and said cavity.

4. A circuit element mounting structure comprising:

a substrate having a pattern A of wirings therein;

at least one cavity formed at a surface of said substrate; and a cap for covering said cavity therewith, said cap including (a) a pattern B of wirings therein and (b) at least one of a recess and a protrusion for electrically connecting said pattern B of wirings to said pattern A of wirings;

said substrate including at least one of a protrusion and a recess, respectively, for electrically connecting said pattern A of wirings to said pattern B;

said recess and protrusion being configured to engage each other.

5. The circuit element mounting structure as set forth in claim 4, wherein there are formed a plurality of pairs of said recesses and protrusions, at least one of said recesses being different in shape from the remainder of said recesses.

6. The circuit element mounting structure as set forth in claim 4, wherein said cap is formed at a surface thereof with at least one terminal for electrically connecting said cap to a circuit element to be mounted on said cap.

7. The circuit element mounting structure as set forth in claim 4, wherein said cap is slightly smaller in size than said cavity so that there is formed a gap between said cap and said cavity.

8. The circuit element mounting structure as set forth in claim 4, wherein said cap has a thickness equal to a depth of said cavity.

9. A circuit element mounting structure comprising:

a substrate having a pattern A of wirings therein;

at least one cavity formed at a surface of said substrate; and a cap for covering said cavity therewith, said cap including (a) a pattern B of wirings therein and (b) a flat surface C having an inclination with respect to a vertical axis of said cap, said flat surface C adapted for electrically connecting said pattern B of wirings to said pattern A of wirings;

said substrate including a flat surface D having the same inclination as that of said flat surface C, said flat surface D adapted for electrically connecting said pattern A of wirings to said pattern B, said flat surfaces C and D being configured to come to facing contact with each other.

10. The circuit element mounting structure as set forth in claim 9, wherein said cap is formed at a surface thereof with at least one terminal for electrically connecting said cap to a circuit element to be mounted on said cap.

11. The circuit element mounting structure as set forth in claim 9, wherein said cap is slightly smaller in size than said cavity so that there is formed a gap between said cap and said cavity.

12. The circuit element mounting structure as set forth in claim 9, wherein said cap has a thickness equal to a depth of said cavity.

13. A circuit element mounting structure comprising:

a substrate having a pattern A of wirings therein;

a least one cavity formed at a surface of said substrate; and a cap for covering said cavity therewith, said cap including (a) a pattern B of wirings therein and (b) an outwardly directing arcuate surface E for electrically connecting said pattern B of wirings to said pattern A of wirings;

said substrate including an inwardly directing arcuate surface F for electrically connecting said pattern A of wirings to said pattern B, said arcuate surfaces E and F being configured to fit with each other.

14. The circuit element mounting structure as set forth in claim 13, wherein said cap is formed at a surface thereof with at least one terminal for electrically connecting said cap to a circuit element to be mounted on said cap.

15. The circuit element mounting structure as set forth in claim 13, wherein said cap is slightly smaller in size than said cavity so that there is formed a gap between said cap and said cavity.

16. The circuit element mounting structure as set forth in claim 13, wherein said cap has a thickness equal to a depth of said cavity.

17. A circuit element mounting structure comprising:

a substrate having a pattern A of wirings therein;

at least one cavity formed at a surface of said substrate; and a cap for covering said cavity therewith, said cap including (a) a pattern B of wirings therein and (b) one of a recess, a protrusion, an inclined flat surface C, and an outwardly directing arcuate surface E, each of which is adapted for electrically connecting said pattern B of wirings to said pattern A of wirings;

said substrate including a protrusion, a recess, a flat surface D having the same inclination as that of said flat surface C, and an inwardly directing arcuate surface F, respectively, each of which is adapted for electrically connecting said pattern A of wirings to said pattern B, said recess and protrusion being configured to engage each other, said flat surfaces C and D being configured to come to facing contact with each other, and said arcuate surfaces E and F being configured to fit with each other.

18. The circuit element mounting structure as set forth in claim 17, wherein said cap is formed at a surface thereof with at least one terminal for electrically connecting said cap to a circuit element to be mounted on said cap.

19. The circuit element mounting structure as set forth in claim 17, wherein said cap is slightly smaller in size than said cavity so that there is formed a gap between said cap and said cavity.

20. The circuit element mounting structure as set forth in claim 17, wherein said cap has a thickness equal to a depth of said cavity.

* * * * *